United States Patent [19]

Nishizawa et al.

[11] 4,414,558
[45] Nov. 8, 1983

[54] HETERO-JUNCTION LIGHT-EMITTING DIODE

[75] Inventors: Jun-ichi Nishizawa, Sendai; Toru Teshima, Yokohama, both of Japan

[73] Assignees: Zaidan Hojin Handotai Kenkyu Shinkokai, Sendai; Stanley Electric Co., Ltd., Tokyo, both of Japan

[21] Appl. No.: 232,967

[22] Filed: Feb. 9, 1981

[30] Foreign Application Priority Data

| Feb. 7, 1980 [JP] | Japan | 55-14504 |
|---|---|---|
| Feb. 7, 1980 [JP] | Japan | 55-14505 |
| Feb. 7, 1980 [JP] | Japan | 55-14506 |
| Feb. 7, 1980 [JP] | Japan | 55-14507 |
| Feb. 7, 1980 [JP] | Japan | 55-14508 |

[51] Int. Cl.³ .................. H01L 33/00; H01L 29/161; H01S 33/19
[52] U.S. Cl. ...................... 357/17; 357/16; 372/50
[58] Field of Search ............... 357/17, 16; 372/50

[56] References Cited

U.S. PATENT DOCUMENTS

| 4,001,055 | 1/1977 | Charmakadze et al. | 357/17 |
|---|---|---|---|
| 4,122,486 | 10/1978 | Ono et al. | 357/17 |
| 4,131,904 | 12/1978 | Ladany et al. | 357/17 |
| 4,137,107 | 1/1979 | Nijman et al. | 357/17 |
| 4,218,692 | 8/1980 | de Cremoux | 357/17 |
| 4,296,425 | 10/1981 | Nishizawa | 357/17 |

FOREIGN PATENT DOCUMENTS

| 2356844 | 4/1976 | Fed. Rep. of Germany . |
|---|---|---|
| 2828195 | 4/1979 | Fed. Rep. of Germany . |
| 2915888 | 10/1979 | Fed. Rep. of Germany . |
| 2251104 | 11/1974 | France . |
| 2232169 | 12/1974 | France . |
| 2423869 | 4/1982 | France . |
| 55-14504 | 2/1980 | Japan . |
| 55-14505 | 2/1980 | Japan . |
| 55-14506 | 2/1980 | Japan . |
| 55-14507 | 2/1980 | Japan . |
| 55-14508 | 2/1980 | Japan . |
| 1467096 | 3/1977 | United Kingdom . |
| 1474942 | 5/1977 | United Kingdom . |
| 1467096 | 3/1977 | United Kingdom . |
| 1474942 | 5/1977 | United Kingdom . |
| 1557072 | 12/1979 | United Kingdom . |

OTHER PUBLICATIONS

R. Blondeau et al., "Viellissement accéléré et dégradation des diodes électroluminescentes à double hétérostructure (GaAl)As–GaAs", *Revue de Physique Appliquee*, vol. 14, (1979), pp. 563–567.

*Primary Examiner*—James W. Davie
*Assistant Examiner*—J. Carroll
*Attorney, Agent, or Firm*—Cushman, Darby & Cushman

[57] ABSTRACT

The emission efficiency of a hetero-junction light-emitting diode is improved by raising the carrier concentration in the radiative region, and by increasing the thickness of the radiative region. On p⁺ type GaAs substrate, a p type $Ga_{1-x}Al_xAs$ (0.30 < X < 0.37) layer and an n type $Ga_{1-y}Al_yAs$ (0.40 < y < 0.70) layer are grown. The emission efficiency are optimized when $$4.5 \times 10^{17} cm^{-3} < p < 2.5 \times 10^{18} cm^{-3}$$

$$2 \times 10^{17} cm^{-3} < n < 1 \times 10^{18} cm^{-3}$$

and the thickness of the p type layer is at least about 5 μm.

7 Claims, 9 Drawing Figures

HETERO-JUNCTION LIGHT-EMITTING DIODE

BACKGROUND OF THE INVENTION

1. Field of the Invention:

The present invention relates to a radiative semiconductor device, and more particularly to a light-emitting diode having a hetero-junction for radiating incoherent light.

2. Description of the Prior Art:

Radiative semiconductor devices are usually formed with compound or compound mixed-crystal semiconductors. Manufacturing processes impose various limitations to the structure of the semiconductor devices. Formation of a doped region is usually done by diffusion or liquid phase epitaxial growth.

Now, some typical examples of conventional light-emitting diodes will be described hereunder.

A GaAsP light-emitting diode is formed with an n+ type GaAs substrate, an n type GaAsP epitaxial layer formed on the n+ type GaAs substrate, and a p type region which is selectively diffused in the n type GaAsP layer. The p type diffusion region has a typical impurity concentration of about $1 \times 10^{18}$ cm$^{-3}$ and is formed to be thin, being below several micrometers, to avoid excessive absorption of propagated light in this p type region. The output light is extracted from that side of this p type region located opposite to the substrate.

A GaP light-emitting diode is formed with an n+ type GaP substrate, an n type epitaxial GaP layer and a p type epitaxial GaP layer, these latter two epitaxial layers being successively grown on said n+ type GaP substrate. The p type layer has a typical impurity concentration of about $1 \times 10^{18}$ cm$^{-3}$. The output light is extracted at the side of this p type layer.

A GaAs light-emitting diode has a structure similar to that of the above-mentioned GaP light-emitting diode. The p type surface layer has a typical impurity concentration of about $2 \times 10^{18}$ cm$^{-3}$. The output light is extracted from at either the side of the p type surface layer or at the side of the n+ type substrate (in this latter case, the substrate is partially etched away at sites where the output light is to be extracted).

A GaAlAs light-emitting diode is formed with a p+ type GaAs substrate, a p type $Ga_{1-x}Al_xAs$ epitaxial layer formed on the GaAs substrate, and an n type $Ga_{1-y}Al_yAs$ epitaxial layer formed on the p type epitaxial layer. The compositions (mixing ratios) x and y are selected to satisfy the condition x<y, to effectively extract the output light at the said of the n type epitaxial layer. Such a light emitting diode is described in U.S. Pat. No. 4,296,425, issued to Nishizawa on Oct. 20, 1981. The Nishizawa patent does not specify the carrier concentrations of the respective regions thereof. However, in practice, the n type epitaxial layer has a typical impurity concentration of about $1 \times 10^{17}$ cm$^{-3}$. The present invention is an improvement of the invention of the Nishizawa patent. As is hereinafter explained, in accordance with the present invention, selecting the carrier concentrations, and compositions in a specific predetermined relationship, provides a very high brightness diode.

It should be understood that there exist several types of structure for the light-emitting diode, and the different considerations should be paid for different structures.

Usually in group III-V compound semiconductor light-emitting diodes, it is easier to obtain better light emission efficiencies in p type regions than in n type regions.

Light-emitting diodes utilize spontaneous emission of radiation (in contrast to stimulated emission of radiation in semiconductor lasers). Therefore, minority carrier lifetime in a light-emitting diode is relatively long. Minority carriers injected into a radiative region across a pn junction have a large possibility of being captured by non-radiative recombination centers and of being recombined with majority carriers thereat without radiating light rays. Thus, it is very important to reduce non-radiative recombination centers in the radiative region of a light-emitting diode.

Lattice defects are largely responsible for the generation of non-radiative recombination centers. Usually, one of the p type and n type regions constituting a pn junction has a smaller density of non-radiative recombination centers, and forms a main radiative region. In GaAs and $Ga_xAl_{1-x}As$, defects are more likely to be formed in an n type region than in a p type region. In an n type region doped with a donor impurity such as Te, Se or S, vacancies may be formed which electrically compensate for the donor atoms. The density of such vacancies is considered to be proportional to the doped concentration. Such vacancies and/or the combinations of vacancy and donor impurity are considered to be very effective non-radiative centers.

In a light-emitting diode having a diffused pn homo-junction, usually zinc(Zn) is diffused as an acceptor impurity into an n type crystal. It is very difficult to diffuse a donor impurity in a p type crystal, because there is no donor impurity which has a diffusion constant as large that of zinc.

Diffusion of zinc naturally makes the carrier concentration in the p type region higher than that in the n type region. The concentration of diffused zinc should not be made too high in order to keep the crystal properties of the diffused p type region good. The n type region into which zinc is diffused should have a lower impurity concentration than that in the p type diffusion. Hence, it is difficult to raise the injection of minority carriers into the radiative region across the pn junction.

Light-emitting diodes manufactured by liquid phase epitaxy generally exhibit higher light emission efficiencies than those of diffused light-emitting diodes. Epitaxial layers have lower defect densities than diffused regions. Furthermore, any combination of impurity concentrations can be selected for an epitaxially grown pn junction. Therefore, in an epitaxial pn homo-junction diode, carrier concentrations of the respective regions are selected to maximize the injection efficiency of minority carriers into the radiative region. For example, in a light-emitting diode having a p type radiative region, the carrier concentration of the p type region is selected sufficiently low as compared with that of the n type region to raise the electron injection into the p type region as compared with the hole injection into the n type region. In any case, the radiative region is arranged to have a low impurity concentration for raising the injection efficiency and the light emitting efficiency.

The hetero-junction light-emitting diode has the advantage of providing a window effect as described above, and can have a higher external efficiency than the homo-junction light-emitting diode.

The hetero-junction diode can have further advantages over the homo-junction light-emitting diode, but its superiorities have not been fully exploited.

SUMMARY OF THE INVENTION

An object of the present invention is to provide a hetero-junction light-emitting diode having an excellent external quantum efficiency.

Another object of the present invention is to provide a hetero-junction light-emitting diode of the type as described above, which has optimized carrier concentrations in the respective p and n type regions which constitute the pn junction.

A further object of the present invention is to provide a hetero-junction light-emitting diode of the type described above, which has a radiative region of an optimized thickness.

In a hetero-junction light-emitting diode, the p type region and the n type region can have different band gaps. In such case, injection efficiency into the respective p type and n type regions is mainly determined by the difference in the band gaps, rather than by the carrier concentrations in the respective p type and n type regions. The present inventors have considered that the radiative region may have a high impurity concentration to increase the concentration of radiative recombination centers. Excessively high impurity concentration, however, will increase various crystal defects such as vacancies, and will lower the light-emission efficiency. Therefore, there should exist an optimum range of carrier concentration for the radiative region. The other region for injecting minority carriers into the radiative region preferably has a high carrier concentration for lowering the resistivity and for injecting a sufficient amount of minority carriers into the radiative region. Excessively high impurity concentration, however, will increase various crystal defects and will lower the light-emission efficiency. Therefore, there should also exist an optimum range of carrier concentration for the injector region.

In GaAs and GaAlAs light-emitting diodes, the main radiative region is preferably a p type region since lattice defects are more likely to be formed in an n type region than in a p type region. The p type impurity may be zinc(Zn), germanium(Ge), and so forth. Among various p type impurities, zinc gives the best emission efficiency. Zinc, however, has a large diffusion constant, and hence can diffuse into the n type region during growth. If zinc diffusion into the n type region is intensive, part of the n type region located adjacent to the p type region may be converted into p type, and the location of the pn junction may be moved. Such displacement of the pn junction will change the emission wavelength to a short one and will vary the pn hetero-junction into a pn homo-junction. This factor also imposes an upper limit of the carrier concentration in the p type regions.

According to the result of experiments conducted by the present inventors, it has been found that better external emission efficiencies are obtained when the p type region has a carrier concentration p in the range of $4.5 \times 10^{17} < p < 2.5 \times 10^{18}$ (cm$^{-3}$) and the n type region has a carrier concentration n in the range of $2 \times 10^{17} < n < 1 \times 10^{18}$ (cm$^{-3}$).

In a light-emitting diode, the diffusion length of minority carriers can become large. Thin radiative region is insufficient to cause most of the injected minority carriers recombined therein. From this viewpoint, the thicker the radiative region is, the higher will become the emission efficiency. However, there also exist internal absorption loss and optimum conditions for reducing lattice defects, etc. which may impose an upper limit for the thickness of the radiative region. Therefore, the optimum range for the thickness of the radiative region was experimentally studied. According to the results of experiments, the emission efficiency increases with the increase in the thickness of the radiative region at least up to 40 $\mu$m. The thickness of the radiative region is preferably equal to or more than about 10 $\mu$m for raising the emission efficiency and is preferably less than 40 $\mu$m from the viewpoint of manufacturing process and economy.

Other objects, features and advantages of the present invention will become apparent in the following description of the preferred embodiments in conjunction with the accompanying drawings.

DESCRIPTION OF THE PREFERRED EMBODIMENTS

Figure 1A:
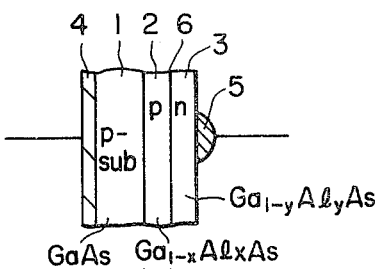
FIGS. 1A and 1B are a schematic partial cross-sectional view and an energy gap diagram of a hetero-junction light-emitting diode.
Figure 1B:
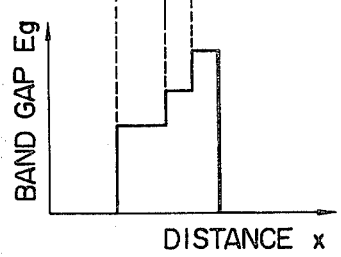

FIG. 1A shows a hetero-junction GaAlAs light-emitting diode. On a p type GaAs substrate 1, a p type $Ga_{1-x}Al_xAs$ layer 2 is epitaxially grown. An n type $Ga_{1-y}Al_yAs$ layer 3 is epitaxially grown on this p type layer 2 to form a pn hetero-junction 6. Compositions x and y are selected to satisfy x<y to realize a band gap profile as shown in FIG. 1B, so that the n type layer 3 is transparent for the light emitted in the p type layer 2. Namely, the n type layer 3 has a wider band gap than the p type layer 2, and the light emitted in the p type layer 2 can be effectively extracted through the n type layer 3 but not through the substrate 1. The p type layer 2 has some absorption coefficient for the light emitted therein. Thus, the closer to the pn junction the position of light emission is, the less absorption will be experienced by the emitted light.

In the structure shown in FIG. 1A, the carrier concentrations of the p type layer 2 and the n type layer 3 were varied to find an optimum combination of the carrier concentrations in the respective layers 2 and 3. Epitaxial growth from solution was employed for forming a pn hetero-junction.

Epitaxial growth is advantageous to form respective layers of uniform electronic property and good crystal property. Around the pn junction, however, there occurs mutual atomic diffusion which results in certain degree of impurity concentration gradient.

Figure 2A:
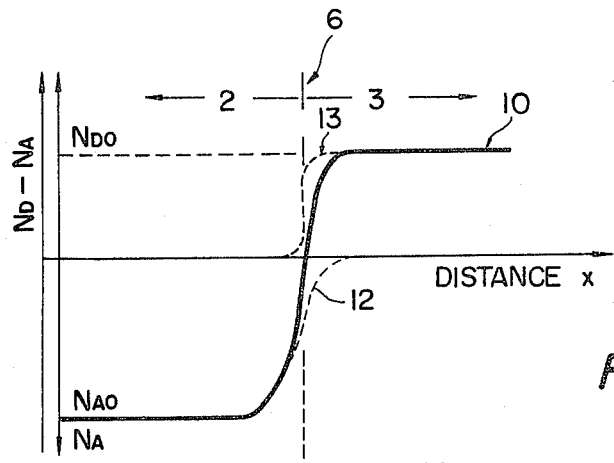
FIGS. 2A and 2B are diagrams of carrier concentration and energy gap in part of the light-emitting diode of FIG. 1A.
Figure 2B:
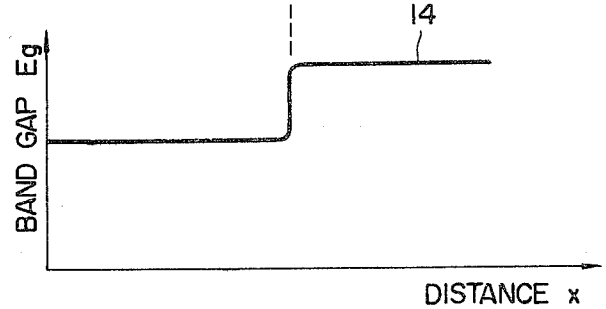

FIGS. 2A and 2B schematically show the impurity concentration distribution (FIG. 2A) and the band gap distribution around the pn junction 6 of FIG. 1A. The abscissas represent the distance in the direction normal to the pn junction and are registered in FIGS. 2A and 2B. The ordinate of FIG. 2A represents the difference $N_D - N_A$ between the donor concentration $N_D$ and the acceptor concentration $N_A$. The donor concentration originally doped in the n type layer 3 is $N_{DO}$ while the acceptor concentration originally doped in the p type region 2 is $N_{AO}$. During the growth, p type and n type impurities are subjected to diffusion. Resultant donor distribution is shown by a dotted curve 13, and resultant acceptor distribution is shown by a dotted curve 12. Thus, the resultant overall net impurity distribution becomes as shown by curve 10. Constituent atoms of the semiconductor are subjected to less degree of diffusion. Therefore, resultant band gap distribution is sharper than the impurity distribution, as shown by a curve 14 of FIG. 2B.

When acceptors (for example, zinc) diffuse into the n type region 3 across the pn junction 6, the acceptor concentration in such portion of the p type region 2 located adjacent to the pn junction decreases. Further, donors diffused into the p type region 2 compensate for acceptors thereat. Thus, the magnitude of net impurity concentrations around the pn junction decreases, but the displacement of the band-gap junction is relatively hard to occur. If the zinc concentration in the p type region 2 is selected to be too high as compared to the donor concentration in the n type region 3, however, the pn junction can be displaced into the wider band-gap originally n type region 3. This leads to the emission of shorter wavelength light and also to a decrease in the emission efficiency due to an increase in electron density at the indirect conduction band edge.

Experiments have been conducted in the range wherein the above-mentioned displacement of the pn junction does not occur or is at most negligible. Epitaxial growth is achieved by the temperature difference method as proposed in Japanese Patent No. 857545 which corresponds to U.S. Patent Application Ser. No. 871,113 now abandoned. Epitaxial growth by gradually cooling the solution is accompanied by variations in composition, impurity concentration and degree of non-stoichiometry. Thus, the impurity and band gap distributions cannot be made as flat as shown in FIGS. 2A and 2B, and also lattice defects cannot be so excellently reduced. Then, the relation between the brightness and the impurity concentrations in the respective regions cannot be clearly observed. On the other hand, according to the temperature difference method, a high temperature supply portion and a low temperature growth portion are held at respective constant temperatures. Raw material dissolves at the supply portion, diffuses through the solution and grows at the growth portion. Therefore, epitaxial growth is performed at a constant growth temperature from a solution of constant composition. Thereby, an epitaxial layer of uniform property can be obtained. By the use of a plurality of solution crucibles and a slider carrying substrates, successive multiple epitaxial growth can be obtained. Except for the pn boundary at which solid phase atomic diffusion varies the impurity concentration and the composition as shown in FIGS. 2A and 2B, the variations in the composition of the respective $Ga_{1-x}Al_xAs$ layer 2 and $Ga_{1-y}Al_yAs$ layer 3, $\Delta x$ and $\Delta y$, can be easily suppressed to not greater than 0.01, and can be suppressed below 0.002 even when the epitaxial layer has a thickness of not less than 10 $\mu$m. For the purpose of comparisons, Al composition x in a $Ga_{1-x}Al_xAs$ layer grown by the gradual cooling method has a tendency of decreasing x with an increase in the growth time, and is usually accompanied by a variation $\Delta x$ of the order of $\Delta x \approx 0.02$ per 10 $\mu$m thickness.

Figure 3:
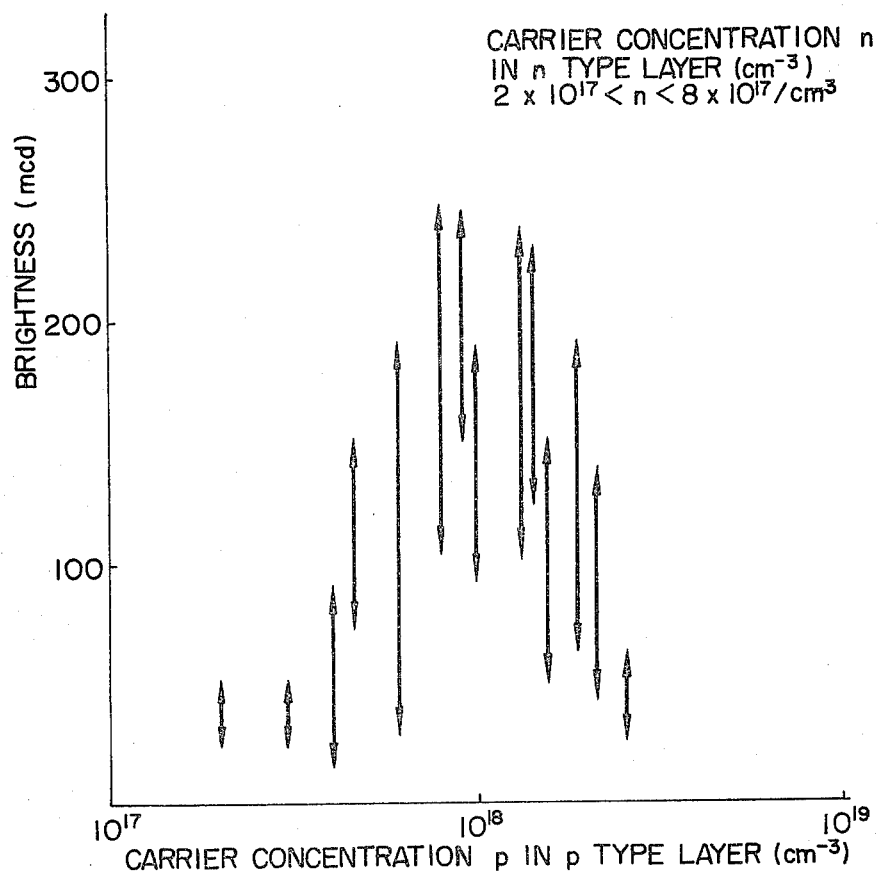
FIGS. 3 and 4 are graphs showing the relation of brightness versus carrier concentration.
Figure 4:
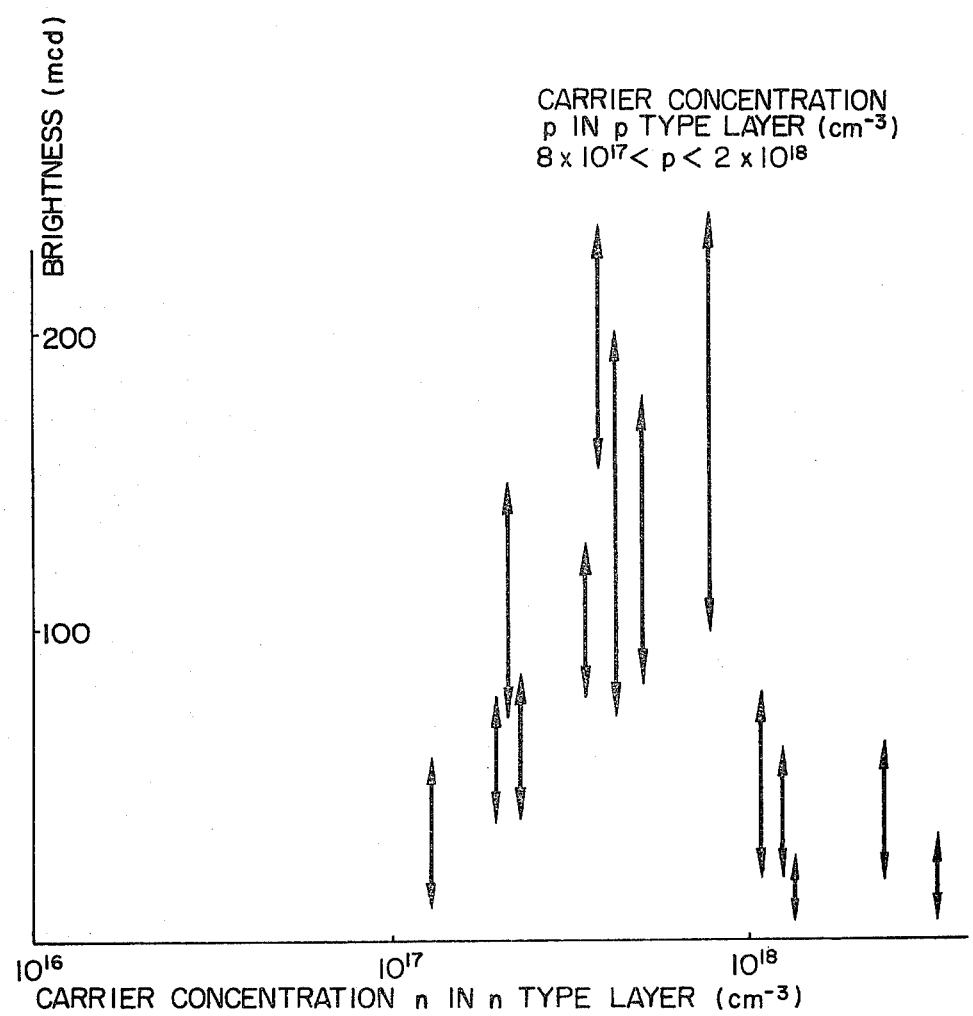

Experimental results are shown in FIGS. 3 and 4, in which abscissas represent carrier concentrations p and n in the p type layer (FIG. 3) and the n type layer (FIG. 4), and the ordinates represent brightness in the unit of millicandles.

It can be seen that the brightness is high, i.e. emission efficiency is high in the ranges of $$4.5 \times 10^{17} \text{ cm}^{-3} < p < 2.5 \times 10^{18} \text{ cm}^{-3}$$

$$2.0 \times 10^{17} \text{ cm}^{-3} < n < 1.0 \times 10^{18} \text{ cm}^{-3}.$$

More preferably, the carrier concentrations p and n may be selected in the ranges of $$8.0 \times 10^{17} \text{ cm}^{-3} \lesssim p \lesssim 2.0 \times 10^{18} \text{ cm}^{-3}$$

$$2.0 \times 10^{17} \text{ cm}^{-3} \lesssim n \lesssim 8.0 \times 10^{17} \text{ cm}^{-3}.$$

The carrier concentration ranges of $$8.0 \times 10^{17} \text{ cm}^{-3} \lesssim p \lesssim 2.0 \times 10^{18} \text{ cm}^{-3}$$

$$4.0 \times 10^{17} \text{ cm}^{-3} \lesssim n \lesssim 8.0 \times 10^{17} \text{ cm}^{-3}$$

are further preferable.

It is further preferable that the acceptor concentration p is selected larger than the donor concentration n, $p > n$, in order to decrease the defect density in the n type region. It is to be noted here that the carrier concentrations p and n mentioned above corresponds to the acceptor and donor concentrations $N_{AO}$ and $N_{DO}$ explained in connection with FIG. 2A.

The composition x of the p type $Ga_{1-x}Al_xAs$ layer 2 was selected in the range of $0.30 \lesssim x \lesssim 0.37$, while the composition y of the n type $Ga_{1-y}Al_yAs$ layer 3 was selected in the range of $0.40 \lesssim y \lesssim 0.70$. When the aluminum composition x of layer 2 exceeds the level of about 0.40, the indiret transition will become dominant and lowers the emission efficiency. Meanwhile, when the aluminum composition x of layer 2 is below about 0.30, the emission wavelength shifts to the region of low visual sensitivity. The composition can be determined by the X ray micro-analysis, but the value obtained may vary according to the calibration method employed. The composition can be determined more precisely by measuring the peak wavelength of emission. The photon energy $h\nu$ and the composition x in the direct transition region of $Ga_{1-x}Al_xAs$ can be represented by $$h\nu(eV) = 1.371 + 1.429X.$$

The photon energy $h\nu$ and the emission wavelength $\lambda(\text{Å})$ are related by the equation $$\lambda = 12400/h\nu(\text{Å}).$$

In the narrow range of 6550 Å $< \lambda <$ 6900 Å, the relation between the emission wavelength and the composition can be approximated as $$\lambda(\text{Å}) = 8468 - 5260x.$$

The dispersion of peak wavelength observed in the emission spectra was less than $\pm 5$ A ($\pm 0.0015$ eV) around 6650 Å. This value corresponds to the variation of composition of less than about 0.002. The carrier concentration can be measured, for example, by forming Schottky contacts on an angle-lapped surface.

Now, description will be made of the effect of the thickness of the radiative region.

If the radiative region exhibits no absorption to the emitting light, the thickness of the radiative region preferably is much larger than the diffusion length, $l_1$, which can be calculated from the equation $l_1 = \sqrt{D\tau}$. An epitaxial layer grown by the gradual cooling method had a minority carrier lifetime $\tau$ of the order of 3 nsec or less and diffusion constant D of the order of 100 cm²/sec or less, thereby the diffusion length was estimated to be of the order of 5 μm. To cause most of the injected minority carriers to be recombined in the radiative region, the radiative region should have a much larger thickness than the diffusion length. However, light which is emitted inside the radiative region is subjected to internal absorption, and growth of a very thick layer using the gradual cooling method is difficult, and makes the light-emitting diode expensive. Usually, the thickness of the radiative region has been selected at about 1 to 2 μm.

However, epitaxial layers of good crystal properties can be obtained using the temperature difference method. For example, the minority carrier lifetime can be of the order of 50 nsec, and the diffusion constant can be of the order of 300 cm²/sec. The present inventors have experimentally studied the dependency of emission efficiency on the thickness of the radiative p type region grown by the temperature difference method.

Experimental results on the light-emitting diodes having a peak emission wavelength of 6650 Å are shown in FIG. 3. Light-emitting diodes having peak emission wavelength at about 6550 to 6900 Å also showed similar tendencies as shown in FIG. 5.

Figure 5:
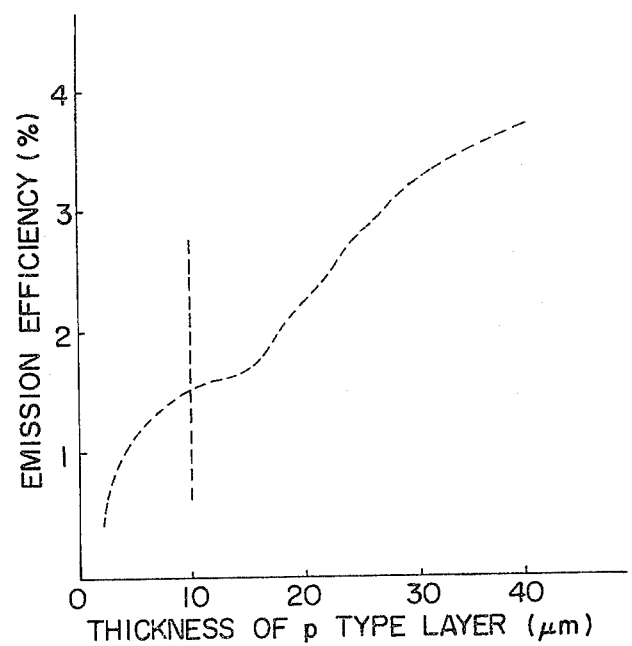
FIG. 5 is a graph showing the relation of brightness versus the thickness of the radiative layer.

It will be apparent from FIG. 5 that at least up to about 40 μm, a higher emission efficiency is obtained from a larger thickness of the radiative region. It is to be noted that the radiative region is grown by relying on the temperature difference method, and has very uniform properties throughout the thickness.

When the thickness is below about 5 μm, the emission efficiency decreases rapidly. Between about 5 μm and about 17 μm, the emission efficiency increases with thickness but shows a saturating tendency. There is observed a kind of kink at about 17 μm. Above about 17 μm, the emission efficiency rises again. Above about 30 μm, some degree of saturating tendency is observed again. Thus, it is desirable to select the thickness of the radiative region at least about 5 μm, preferably more than 10 μm, and further preferably more than about 17 μm. Thicknesses above 40 μm are, at least in the present stage of manufacturing technique, not easy to achieve and not economical.

At the optimized conditions of thickness, impurity concentrations and the composition, GaAlAs light-emitting diodes molded with epoxy resin were noted to exhibit external emission efficiency of about 4% (internal emission efficiency of about 27%).

The rapid decrease in the emission efficiency below the thickness of about 5 μm can be considered as follows. Although the lattice of $Ga_{1-x}Al_xAs$ matches well with that of GaAs as compared with other hetero-junctions such as $GaAs$-$GaAs_{1-x}P_x$, the GaAs substrates usually have a lower purity and a higher defect density than the $Ga_{1-x}Al_xAs$ epitaxial layer. Thus, such lattice defects and impurity atoms can be transferred or produce effects into the epitaxial layer over the hetero-junction to some extent. Excessively thin epitaxial layers can be influenced more by the defects and/or impurities in the substrate, causing a lower emission efficiency. The upper limit of the practical thickness of the epitaxial layer is determined by the manufacturing techniques and cost.

A modification of the light-emitting diode structure which provides for a high emission efficiency by a simple process will be described below.

Figure 6A:
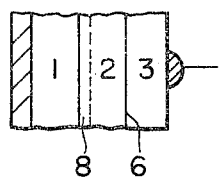
FIGS. 6A and 6B are a schematic partial cross-sectional view and a band gap diagram showing a modification of the light-emitting diode of FIG. 1A.
Figure 6B:
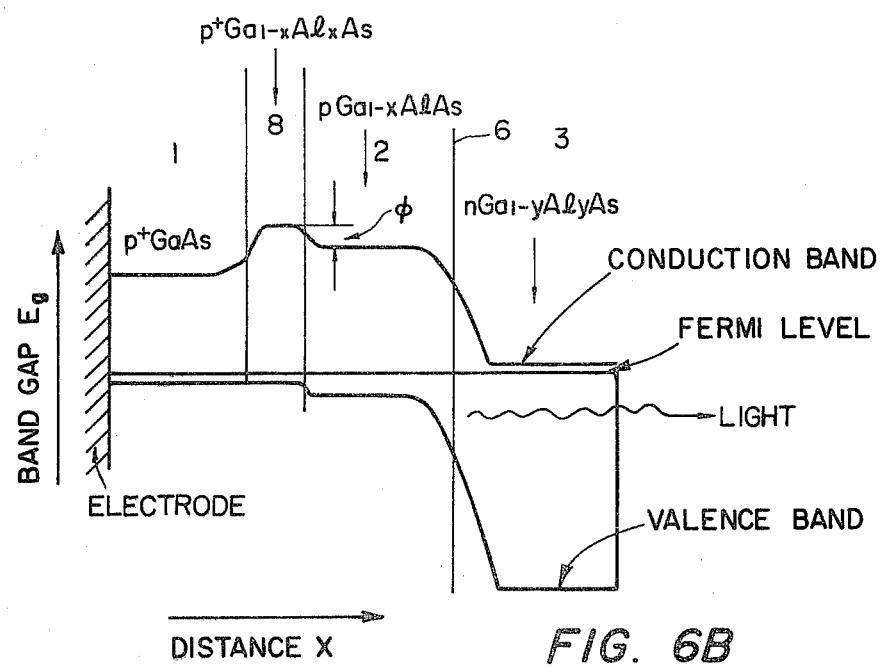

When a p type $Ga_{1-x}Al_xAs$ layer 2 is grown on a p+ type GaAs substrate 1 which has a much higher acceptor concentration than that of the epitaxial layer 2, acceptor atoms in the substrate 1 diffuse into the p type $Ga_{1-x}Al_xAs$ epitaxial layer to form a thin p+ type $Ga_{1-x}Al_xAs$ layer 8 as shown in FIG. 6A. The p+ type $Ga_{1-x}Al_xAs$ layer 8 has a higher potential than the p type $Ga_{1-x}Al_xAs$ layer 2 for electrons as shown in FIG. 6B. The potential difference, represented by $\phi$ in FIG. 6B, serves to reflect electrons injected from the n type $Ga_{1-y}Al_yAs$ layer 3 across the pn junction 6. The reflected electrons subject to possible radiative recombination in the p type $Ga_{1-x}Al_xAs$ layer 2. The p+ type $Ga_{1-x}Al_xAs$ layer 8 may be formed by an epitaxial growth as a matter of course, but preferably is formed by the use of diffusion from the substrate without increasing the number of manufacturing steps as described above. For causing such diffusion, the substrate should be doped with an acceptor having a large diffusion constant. Thus, it is preferable to use zinc-doped p+ type substrate.

The potential barrier formed by difference in the carrier concentration is not very high. Thus, it is desirable that the thickness of the p+ type $Ga_{1-x}Al_xAs$ layer 8 be not much smaller than the diffusion length therein.

The height of the potential barrier $\phi$ is determined by the acceptor concentration p+ of the highly-doped $Ga_{1-x}Al_xAs$ layer 8 and by the acceptor concentration p of the grown $Ga_{1-x}Al_xAs$ layer 2, as:

$$\phi = kT\ln(p^+/p).$$

About one half of the electrons will be prevented from diffusion when $$p^+ \gtrsim 2.7p \ldots \quad (1),$$

and most of the electrons will be prevented from diffusion when $$p^+ \gtrsim 7.5p \ldots \quad (2)$$

according to the Maxwell-Boltzman distribution. If the impurity of the p+ type GaAs substrate 1 is zinc, the impurity concentration in that part of the $Ga_{1-x}Al_xAs$ layer 2 located adjacent to the substrate 1 approaches considerably to that of the substrate 1. For example, when the p+ type GaAs substrate 1 has a zinc impurity concentration of above about $1 \times 10^{19}$ cm$^{-3}$, and when a p type $Ga_{1-x}Al_xAs$ layer 2 having an acceptor concentration of about $1 \times 10^{18}$ cm$^{-3}$ is grown thereon, a p+ type $Ga_{1-x}Al_xAs$ layer 8 satisfying the condition (2) can be produced. It is to be noted that this effect becomes apparent only when the epitaxial layer has a uniform composition, since a potential barrier of about 46 meV corresponds to a composition difference $\Delta x$ of about 0.03.

Although description has been made on limited number of embodiments, the scope of the present invention is not limited thereto. For example, a small amount of phosphorus (P) may be added to the p type and/or n type region for further improving the lattice matching without causing substantial change to other physical properties. Better lattice matching will reduce the lattice defects such as misfit dislocations at the hetero-junction and improve the emission efficiency.

Other modifications, alternation and combinations of the described embodiments will be apparent to those skilled in the art.

What is claimed is:

1. A hetero-junction light emitting diode for emitting light through a predetermined surface thereof comprising:
   a p-type GaAs substrate having a first carrier concentration $p_1$;
   a relatively low band-gap p-type semiconductor region disposed on said substrate, said p-type region being composed of $Ga_{1-x}Al_xAs$ ($0.3 < x < 0.37$), and having a second carrier concentration $p_2$, where: $p_2 < p_1$, and $4.5 \times 10^{17}$ cm$^{-3}$ < $p_2$ < $2.5 \times 10^{18}$ cm$^{-3}$; and
   a relatively high band-gap n-type semiconductor region disposed on said p-type region adjacent to said predetermined diode surface, said n-type region being composed of $Ga_{1-y}Al_yAs$ ($y > x$), and having a carrier concentration n, where n is less than the carrier concentration $p_2$ of said p-type region, and $2 \times 10^{17}$ cm$^{-3}$ < n < $1 \times 10^{18}$ cm$^{-3}$, said n-type region forming a pn hetero-junction with said p-type region having a face generally parallel to said diode predetermined surface;
   said substrate, and n-type and p-type regions being disposed such that light rays derived in said diode are in a direction perpendicular to said face of said hetero-junction for emission through said predetermined surface.

2. The hetero-junction light-emitting diode according to claim 1, wherein: said carrier concentration $p_1$ of the p type region is determined mainly by zinc impurity doped therein.

3. The hetero-junction light-emitting diode according to claim 1, wherein: said p type region has a thickness of at least about 5 μm.

4. The hetero-junction light-emitting diode according to claim 1, wherein: said p type region has a thickness of at least about 10 μm.

5. The hetero-junction light-emitting diode according to claim 1, wherein: said p type region has a thickness of at least about 17 μm.

6. The hetero-junction light-emitting diode according to claim 1, further comprising:
   another p type region having substantially a same composition as that of said p type region and a carrier concentration $p^+$ and disposed between said substrate and said p type region, the carrier concentration $p^+$ satisfying the condition $$p^+ \gtrsim 2.7 \times p_2.$$

7. The hetero-junction light-emitting diode according to claim 1 or 6, wherein: the variation of said composition x, $\Delta x$ throughout said p type region satisfies the condition $\Delta x < 0.01$.

* * * * *